(12) United States Patent
Iwabuchi et al.

(10) Patent No.: US 8,217,687 B2
(45) Date of Patent: Jul. 10, 2012

(54) CAPACITIVE LOAD DRIVER

(75) Inventors: Akio Iwabuchi, Niiza (JP); Shohei Osaka, Niiza (JP); Satoru Washiya, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 87 days.

(21) Appl. No.: 12/907,307

(22) Filed: Oct. 19, 2010

(65) Prior Publication Data

US 2011/0089980 A1 Apr. 21, 2011

(30) Foreign Application Priority Data

Oct. 20, 2009 (JP) ................................. 2009-241369

(51) Int. Cl.
*H03B 1/00* (2006.01)
(52) U.S. Cl. ....................................... 327/111; 327/586
(58) Field of Classification Search ........................ None
See application file for complete search history.

(56) References Cited

U.S. PATENT DOCUMENTS 5,694,071 A * 12/1997 Hurkx et al. ................. 327/314
7,852,127 B2 * 12/2010 Kitazawa et al. ............ 327/112

FOREIGN PATENT DOCUMENTS

| JP | 9-322560 | 12/1997 |
| JP | 2005-49378 | 2/2005 |
| JP | 2005-202256 | 7/2005 |
| JP | 2005-227337 | 8/2005 |
| WO | WO 2009/119275 A1 | 10/2009 |

OTHER PUBLICATIONS

Japanese Office Action issued Oct. 11, 2011, in Patent Application No. 2009-241369. (with English Outline).

* cited by examiner

*Primary Examiner* — An Luu
(74) *Attorney, Agent, or Firm* — Oblon, Spivak, McClelland, Maier & Neustadt, L.L.P.

(57) ABSTRACT

A capacitive load driver includes a first switching element whose first end receives positive potential, an EL element arranged between a second end of the first switching element and the ground, a charge collecting capacitor whose first end is connected to a positive electrode terminal of the EL element, a voltage source connected between a second end of the charge collecting capacitor and the ground, and a controller. The controller charges a parasitic capacitance of the EL element and the charge collecting capacitor, and thereafter, applies negative potential from the voltage source to the second end of the charge collecting capacitor. Thereafter, the controller brings the output voltage of the voltage source to ground potential so that the charge collecting capacitor is discharged to charge the EL element. The capacitance of the charge collecting capacitor is set to be sufficiently greater than that of the parasitic capacitance.

7 Claims, 4 Drawing Sheets

CAPACITIVE LOAD DRIVER

BACKGROUND OF THE INVENTION

1. Field of the Invention

The present invention relates to a capacitive load driver for driving a capacitive load such as an EL (electroluminescence) element, and particularly, to a technique of improving the power efficiency of such a capacitive load driver.

2. Description of the Related Art

A problem that arises when an EL element is pulse-driven is that the charge of a parasitic capacitance of the EL element is entirely abandoned at the time of discharge, to deteriorate power efficiency. To deal with this problem, some related art partly collects the charge of the parasitic capacitance with a charge collecting capacitor and reuses the collected charge to improve power efficiency.

For example, Japanese Unexamined Patent Application Publication No. H09-322560 (Document 1) discloses a capacitive load driver of improved power efficiency. This related art connects the charge and discharge electrodes of an EL element to a capacitor through a switching circuit. When discharging the EL element, the related art partly transfers the charge of the EL element to the capacitor and discharges the remaining charge of the EL element. Thereafter, the related art returns the transferred charge from the capacitor to the EL element when charging the EL element.

This related art partly reuses the charge accumulated in the EL element, to improve power efficiency by the reused charge.

SUMMARY OF THE INVENTION

The capacitive load driver according to the above-mentioned related art repeats the steps of partly collecting charge accumulated in the EL element with the capacitor, discarding the remaining charge of the EL element, and charging the EL element in combination with using the charge of the capacitor.

The related art reclaims charge from the EL element only as much as half the amount necessary for fully charging the EL element. Namely, the related art has a poor charge collecting rate, and therefore, is unable to improve power efficiency.

The present invention provides a capacitive load driver capable of improving power efficiency.

According to a first aspect of the present invention, the capacitive load driver includes a first switching element whose first end is configured to receive positive potential, a capacitive load arranged between a second end of the first switching element and the ground, a charge collecting capacitor whose first end is connected to a positive electrode terminal of the capacitive load, a voltage source connected between a second end of the charge collecting capacitor and the ground, and a controller configured to control the first switching element and voltage source. The controller charges a parasitic capacitance of the capacitive load and the charge collecting capacitor, and thereafter, applies negative potential from the voltage source to the second end of the charge collecting capacitor so that the parasitic capacitance is reversely biased and discharged to charge the charge collecting capacitor. Thereafter, the controller brings the output voltage of the voltage source to ground potential so that the charge collecting capacitor is discharged to charge the capacitive load. The capacitance of the charge collecting capacitor is set to be sufficiently greater than that of the parasitic capacitance.

According to a second aspect of the present invention, the capacitive load driver includes a power generator configured to output positive potential, a capacitive load arranged between a first end of the power generator and the ground, a charge collecting capacitor whose first end is connected to a positive electrode terminal of the capacitive load, a first switching element arranged between a second end of the charge collecting capacitor and the ground, a second switching element having a first end connected to the second end of the charge collecting capacitor and a second end to which negative potential is externally applied, and a controller configured to control the power generator, first switching element, and second switching element. The controller charges a parasitic capacitance of the capacitive load and the charge collecting capacitor, and thereafter, applies the negative potential to the second end of the charge collecting capacitor so that the parasitic capacitance is reversely biased and discharged to charge the charge collecting capacitor. Thereafter, the controller discharges the charge collecting capacitor, to charge the capacitive load. The power generator stops the positive potential in response to a control signal from the controller.

DESCRIPTION OF THE PREFERRED EMBODIMENT

Capacitive load drivers according to embodiments of the present invention will be explained in detail with reference to the drawings.

Embodiment 1

Figure 1:
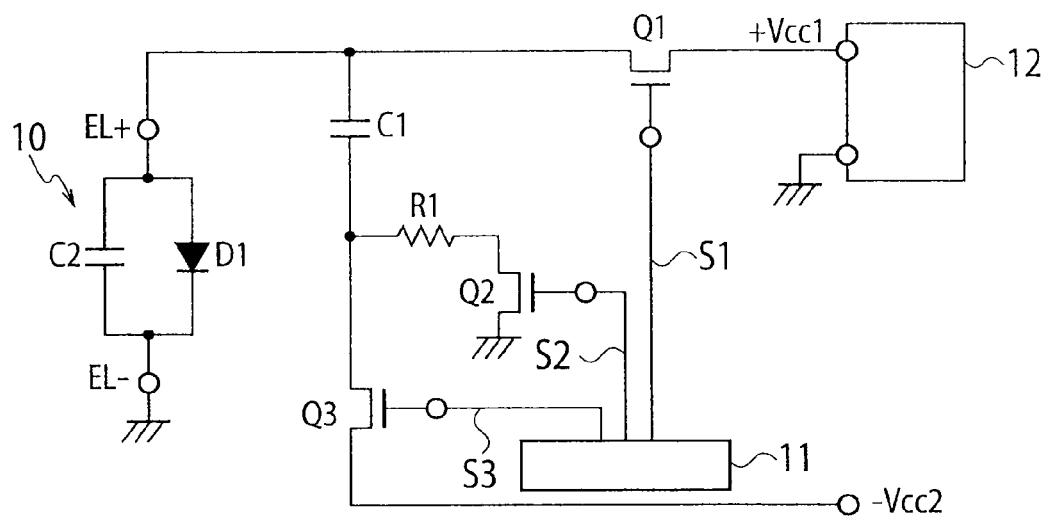
FIG. 1 is a circuit diagram illustrating a capacitive load driver according to Embodiment 1 of the present invention.

FIG. 1 is a circuit diagram illustrating a capacitive load driver according to Embodiment 1 of the present invention. The capacitive load driver includes a first switching element Q1, a second switching element Q2, a third switching element Q3, a capacitor C1, a resistor R1, an EL element 10 serving as a capacitive load, a controller 11, and a power generator 12.

The first switching element Q1 is made of, for example, a MOSFET. A first end of the first switching element Q1 receives positive potential +Vcc1 from the power generator 12 that is connected to the outside. A second end of the first switching element Q1 is connected to a first end of the capacitor C1 and a positive electrode terminal EL+ of the EL element 10. The first switching element Q1 turns on/off in response to a control signal S1 provided from the controller 11 to a control terminal of the first switching element Q1, to control the supply of the positive potential +Vcc1 from the power generator 12.

A second end of the capacitor C1 is connected to a first end of the resistor R1 and a first end of the third switching element Q3. The capacitor C1 is employed as a charge collector and is stipulated as "a charge collecting capacitor" in the claims. A second end of the resistor R1 is connected to a first end of the second switching element Q2.

The second switching element Q2 is, for example, a MOSFET and turns on/off in response to a control signal S2 provided from the controller 11 to a control terminal of the second switching element Q2. A second end of the second switching element Q2 is grounded.

The third switching element Q3 is made of, for example, a MOSFET and turns on/off in response to a control signal S3 provided from the controller 11 to a control terminal of the third switching element Q3. A second end of the third switching element Q3 receives negative potential −Vcc2.

The positive potential +Vcc1 and negative potential −Vcc2 are set to satisfy a relationship of |−Vcc2|>|+Vcc1|.

The EL element 10 is equivalently represented with a parallel circuit that includes a diode D1 and a parasitic capacitance C2. A negative electrode terminal EL− of the EL element 10 is grounded. The capacitance of the capacitor C1 is set to be sufficiently larger than that of the parasitic capacitance C2 and is, for example, 2 to 100 times as large as the capacitance of the parasitic capacitance C2.

The controller 11 generates the control signals S1, S3, and S3 and sends them to the switching elements Q1, Q2, and Q3, respectively, thereby turning on/off the switching elements Q1, Q2, and Q3.

The power generator 12 outputs the positive potential +Vcc1 to the first end of the first switching element Q1. The power generator 12 may be configured like the drive voltage generator of Document 1.

Operation of the capacitive load driver according to Embodiment 1 will be explained with reference to FIGS. 2 to 5.

The controller 11 makes the control signal S1 high (FIG. 2B), the control signal S2 high (FIG. 2C), and the control signal S3 low (FIG. 2D), to establish a state I.

With these control signals, the first and second switching elements Q1 and Q2 turn on and the third switching element Q3 turns off. Then, as indicated with arrows in FIG. 3, the positive potential +Vcc1 from the power generator 12 charges the capacitor C1. At the same time, the EL element 10 is forwardly biased to charge the parasitic capacitance C2. As results, the voltage of the parasitic capacitance C2 becomes +Vcc1 (FIG. 2A) to light the EL element 10.

Thereafter, the controller 11 makes the control signal S1 low (FIG. 2B), the control signal S2 low (FIG. 2C), and the control signal S3 high (FIG. 2D), to establish a state II. With these control signals, the first and second switching elements Q2 turn off and the third switching element Q3 turns on. Then, as depicted by arrows in FIG. 4, the EL element 10 is reversely biased to discharge the parasitic capacitance C2 and charge the capacitor C1 without discarding the charge of the parasitic capacitance C2.

Then, the voltage of the parasitic capacitance C2 becomes negative potential of −Vcc2+Vcc1 (FIG. 2A). The capacitor C1 is connected to the negative potential −Vcc2 supplied from the outside, to improve a charge collecting rate higher than the above-mentioned related art.

Thereafter, the controller 11 makes the control signal S1 low (FIG. 2B), the control signal S2 high (FIG. 2C), and the control signal S3 low (FIG. 2D), to establish a state III. With these control signals, the first and third switching elements Q1 and Q3 turn off and the second switching element Q2 turns on.

Figure 5:
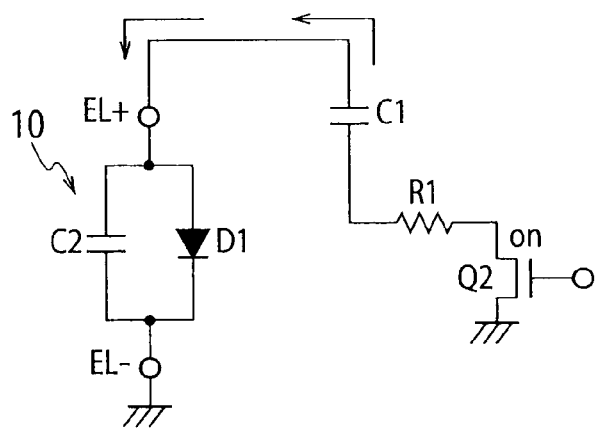

Then, as indicated with arrows in FIG. 5, the collected charge in the capacitor C1 is discharged to forwardly bias the EL element 10 and charge the parasitic capacitance C2, thereby reusing the collected charge. The voltage of the parasitic capacitance C2 becomes the positive potential +Vcc1 as illustrated in FIG. 2A.

The states I, II, and III are repeated in this order. Since the EL element 10 is reversely biased when it is turned off, the charge of the parasitic capacitance C2 of the EL element 10 is reused without discarded. This results in improving power efficiency.

Embodiment 2

Figure 6:
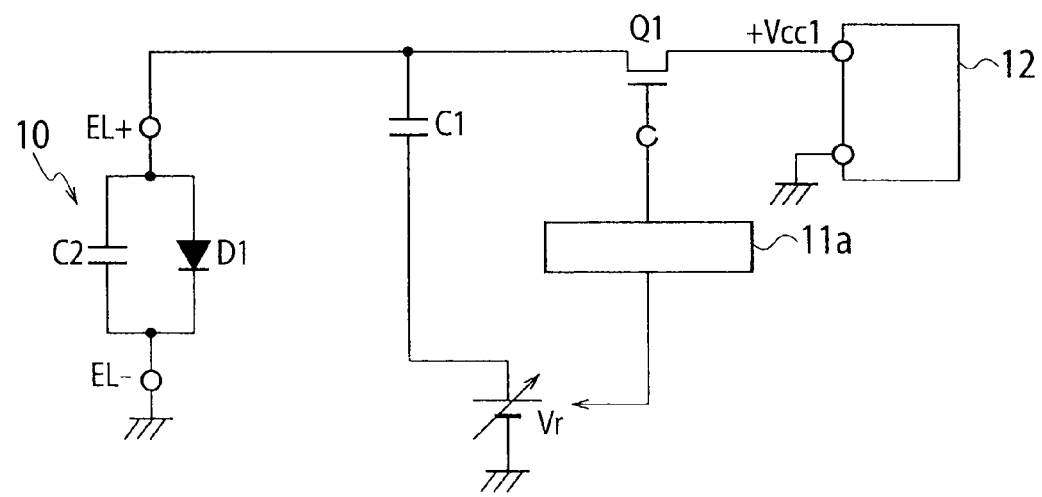
FIG. 6 is a circuit diagram illustrating a capacitive load driver according to Embodiment 2 of the present invention.

FIG. 6 is a circuit diagram illustrating a capacitive load driver according to Embodiment 2 of the present invention. Parts of Embodiment 2 that are common to those of Embodiment 1 illustrated in FIG. 1 are represented with the same reference marks, to omit their explanations. Compared with Embodiment 1, Embodiment 2 omits the resistor R1 and second and third switching elements Q2 and Q3, additionally employs a variable power source Vr, and adopts a controller 11a having different functions from the controller 11 of Embodiment 1. According to Embodiment 1, the controller 11 controls the two voltage sources (−Vcc2 and ground potential) on the ground potential side of the capacitor C1. According to Embodiment 2, the controller 11a controls the variable power source Vr, to provide the capacitor C1 with two potential values on the ground potential side of the capacitor C1. Characteristic parts of Embodiment 2 will be explained.

A first end of the capacitor C1 is connected to a second end of a first switching element Q1 and a positive electrode terminal EL+ of an EL element 10 serving as a capacitive load. A second end of the capacitor C1 is connected to a first end of the variable power source Vr.

In response to a control signal S4 from the controller 11a, the variable power source Vr provides an output voltage in the range of 0 V to negative potential −Vcc2 to the second end of the capacitor C1.

The controller 11a generates a control signal S1 and the control signal S4 and sends them to the first switching element Q1 and variable power source Vr, respectively, thereby controlling ON/OFF of the first switching element Q1 and the output voltage of the variable power source Vr.

Operation of the capacitive load driver according to Embodiment 2 will be explained.

The controller 11a activates the control signal S1 and sets the output of the variable power source Vr to 0 V, thereby establishing a state I. In this state, the first switching element Q1 turns on, so that positive potential +Vcc1 from a power generator 12 charges the capacitor C1. At the same time, the EL element 10 is forwardly biased to charge a parasitic capacitance C2. As a result, the voltage of the parasitic capacitance C2 becomes +Vcc1.

The controller 11a deactivates the control signal S1 and sets the output of the variable power source Vr to −Vcc2, thereby establishing a state II. In this state, the first switching element Q1 turns off and the EL element 10 is reversely biased to discharge the parasitic capacitance C2 and charge the capacitor C1 without discarding the charge of the parasitic capacitance C2. As a result, the voltage of the parasitic capacitance C2 becomes negative potential of −Vcc2+Vcc1. The capacitor C1 receives the negative potential −Vcc2 from the variable power source Vr, to improve a charge collecting rate higher than the above-mentioned related art.

The controller 11a deactivates the control signal S1 and sets the output of the variable power source Vr to 0 V, thereby establishing a state III. In this state, the first switching element Q1 turns off and the capacitor C1 is discharged to forwardly bias the EL element 10 and charge the parasitic capacitance C2, thereby reusing the charge collected in the capacitor C1. The voltage of the parasitic capacitance C2 becomes the positive potential +Vcc1.

The states I, II, and III are repeated in this order. Since the EL element 10 is reversely biased when it is turned off, the charge of the parasitic capacitance C2 of the EL element 10 is reused without discarded, to thereby improve power efficiency.

As mentioned above, the capacitive load driver according to any one of Embodiments 1 and 2 includes the first switching element Q1 whose first end receives the positive potential +Vcc1, the EL element 10 arranged between the second end of the first switching element Q1 and the ground, the charge collecting capacitor C1 whose first end is connected to the positive electrode terminal EL+ of the EL element 10, the voltage source (Q2, Q3; Vr) connected to the second end of the capacitor C1, and the controller (11, 11a) to control the first switching element Q1 and voltage source. The controller charges the parasitic capacitance C2 of the EL element 10 and the capacitor C1, makes the voltage source apply the negative potential −Vcc1 to the second end of the capacitor C1 so that the EL element 10 is reversely biased to discharge the parasitic capacitance C2 and charge the capacitor C1, and sets the output of the voltage source to ground potential so that the capacitor C1 is discharged to charge the parasitic capacitance C2 of the EL element 10. The capacitance of the capacitor C1 is set to be sufficiently larger than that of the parasitic capacitance C2 of the EL element 10.

Embodiment 3

Figure 7:
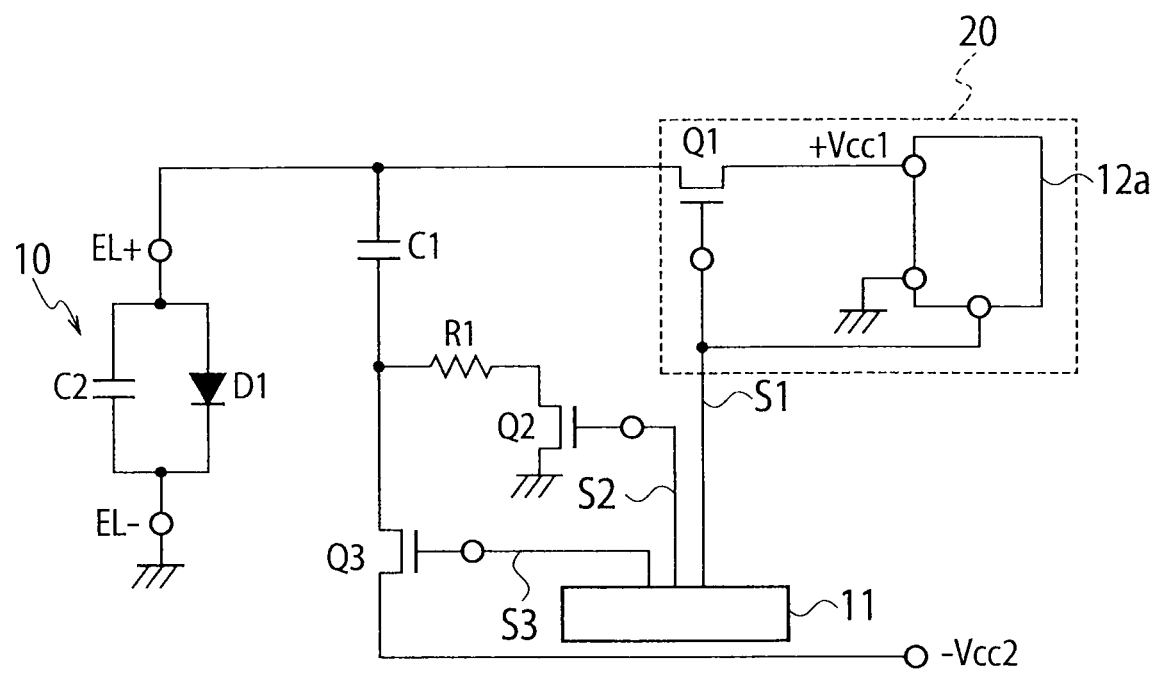
FIG. 7 is a circuit diagram illustrating a capacitive load driver according to Embodiment 3 of the present invention.

FIG. 7 is a circuit diagram illustrating a capacitive load driver according to Embodiment 3 of the present invention. Parts of Embodiment 3 that are common to those of Embodiment 1 illustrated in FIG. 1 are represented with the same reference marks, to omit their explanations. Embodiment 3 differs from Embodiment 1 in that Embodiment 3 employs a power generator 12a in place of the power generator 12 of Embodiment 1. The power generator 12a generates positive potential +Vcc1 in response to a control signal S1 outputted from a controller 11. To forwardly bias an EL element 10 like the state I of FIG. 2, the controller 11 provides the power generator 12a with the control signal S1 of, for example, high level so that the power generator 12a generates the positive potential +Vcc1.

Figure 2:
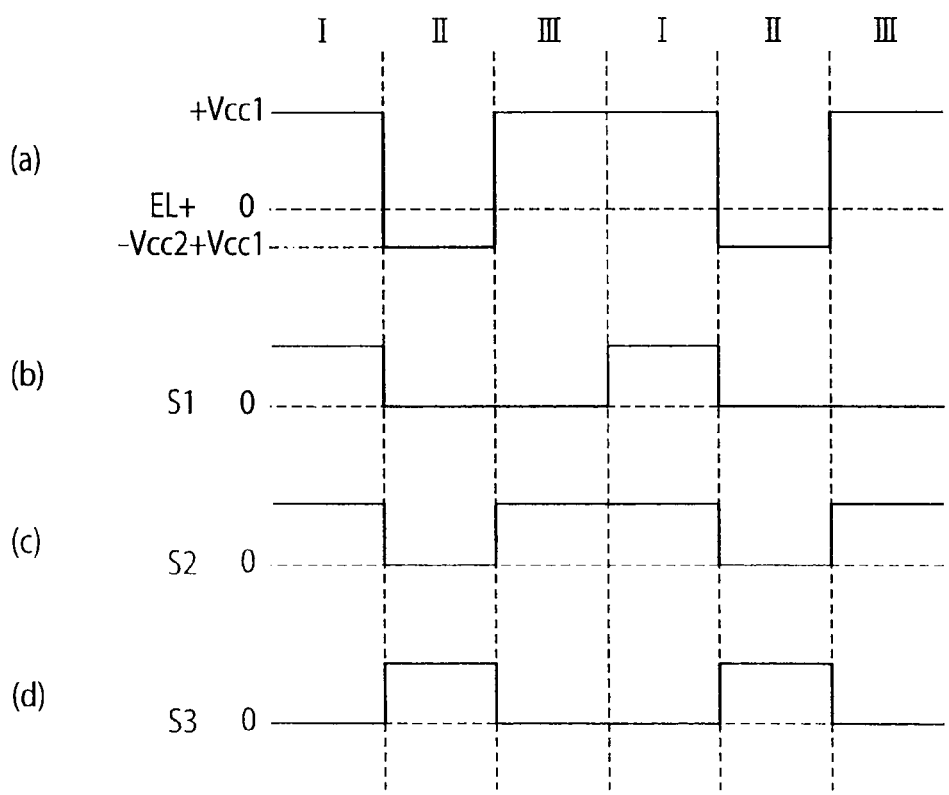
FIG. 2 is a timing chart explaining operation of the capacitive load driver according to Embodiment 1.
Figure 3:
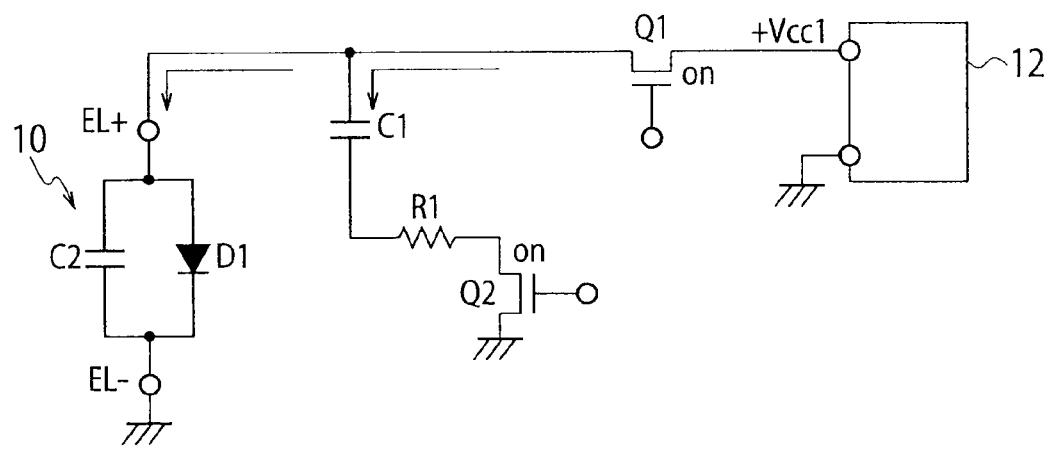
FIGS. 3 to 5 are circuit diagrams explaining operation of the capacitive load driver according to Embodiment 1.
Figure 4:
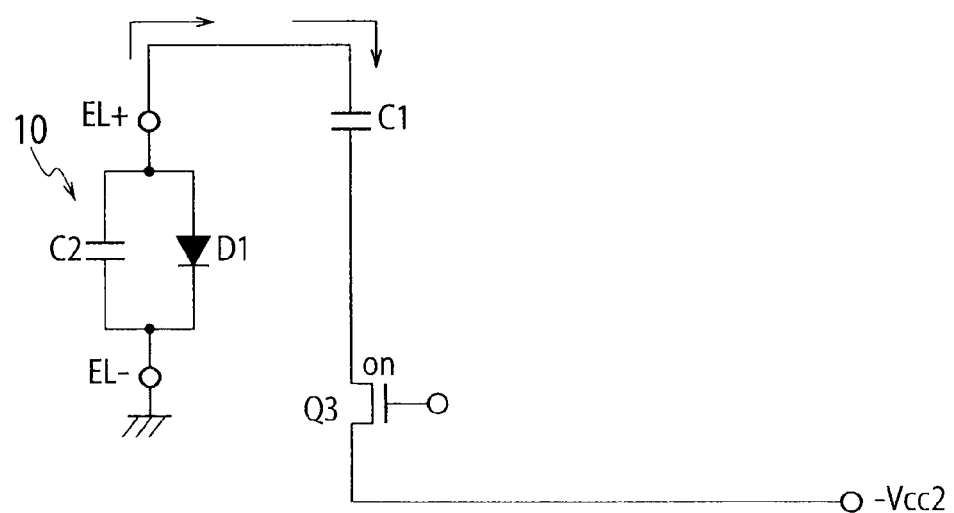

To collect charge from the EL element 10 like the state II of FIG. 2, or to reuse the charge of a capacitor C1 like the state III of FIG. 2, the controller 11 provides the power generator 12a with the control signal 51 of, for example, low level so that the power generator 12a stops the positive potential +Vcc1. This configuration improves the power efficiency of the capacitive load driver, compared with the case of always providing the positive potential +Vcc1.

The power generator 12a and a first switching element Q1 may be considered as a power generator 20. It is possible to use an ON resistance of the switching element Q1 as a current detection element to control the output power of the power generator 12a.

In this way, the capacitive load driver according to the present invention reversely biases the EL element 10 when it is turned off and reuses the charge of the parasitic capacitance C2 of the EL element 10 without discarding the same, thereby improving power efficiency.

The present invention is applicable to drive capacitive loads such as EL elements and piezoelectric elements.

This application claims benefit of priority under 35USC §119 to Japanese Patent Application No. 2009-241369, filed on Oct. 20, 2009, the entire contents of which are incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A capacitive load driver comprising:
a first switching element whose first end is configured to receive positive potential;
a capacitive load arranged between a second end of the first switching element and the ground;
a charge collecting capacitor whose first end is connected to a positive electrode terminal of the capacitive load;
a voltage source connected between a second end of the charge collecting capacitor and the ground; and
a controller of the first switching element and voltage source configured to:
charge a parasitic capacitance of the capacitive load and the charge collecting capacitor, and thereafter, apply negative potential from the voltage source to the second end of the charge collecting capacitor thereby the parasitic capacitance is reversely biased and discharged to charge the charge collecting capacitor, and bring the output voltage of the voltage source to ground potential so that the charge collecting capacitor is discharged to charge the capacitive load, wherein
the capacitance of the charge collecting capacitor is set to be greater than that of the parasitic capacitance.

2. The capacitive load driver of according to claim 1, wherein
the absolute value of the negative potential is greater than that of the positive potential.

3. The capacitive load driver according to claim 1, wherein the voltage source includes:
a second switching element arranged between the second end of the charge collecting capacitor and the ground; and
a third switching element having a first end connected to the second end of the charge collecting capacitor and a second end configured to receive the negative potential.

4. The capacitive load driver according to claim 3, wherein the controller is configured to:
turn on the first and second switching elements and off the third switching element so that the parasitic capacitance of the capacitive load and the charge collecting capacitor are charged, and thereafter, turn off the first and second switching elements and on the third switching element so that the negative potential is applied to the second end of the charge collecting capacitor and the parasitic capacitance is reversely biased and discharged to charge the charge collecting capacitor; and thereafter
turn off the first and third switching elements and on the second switching element so that the charge collecting capacitor is discharged to charge the capacitive load.

5. The capacitive load driver according to claim 1, wherein the voltage source is a variable power source whose output potential is controlled by the controller.

6. The capacitive load driver according to claim 1, wherein the capacitive load is an EL element.

7. A capacitive load driver comprising:
a power generator configured to output positive potential;

a capacitive load arranged between a first end of the power generator and the ground;

a charge collecting capacitor whose first end is connected to a positive electrode terminal of the capacitive load;

a first switching element arranged between a second end of the charge collecting capacitor and the ground;

a second switching element having a first end connected to the second end of the charge collecting capacitor and a second end to which negative potential is externally applied; and a controller configured to:

charge a parasitic capacitance of the capacitive load and the charge collecting capacitor, and thereafter, apply the negative potential to the second end of the charge collecting capacitor so that the parasitic capacitance is reversely biased and discharged to charge the charge collecting capacitor; and thereafter discharge the charge collecting capacitor, to charge the capacitive load, wherein the power generator stops output of the positive potential in response to a control signal of the controller.

* * * * *